United States Patent [19]
Luz et al.

[11] Patent Number: 5,602,874
[45] Date of Patent: Feb. 11, 1997

[54] METHOD AND APPARATUS FOR REDUCING QUANTIZATION NOISE

[75] Inventors: Yuda Y. Luz, Prairie View; James F. Long, Glen Ellyn, both of Ill.

[73] Assignee: Motorola, Inc., Schaumburg, Ill.

[21] Appl. No.: 389,474

[22] Filed: Feb. 14, 1995

Related U.S. Application Data

[63] Continuation-in-part of Ser. No. 366,283, Dec. 29, 1994.
[51] Int. Cl.⁶ .................................................. H04B 14/04
[52] U.S. Cl. ........................... 375/243; 341/126; 341/200
[58] Field of Search .................................... 375/241, 243, 375/254; 341/50, 126, 143, 144, 200

[56] References Cited

U.S. PATENT DOCUMENTS

| | | |
|---|---|---|
| 3,991,277 | 11/1976 | Hirata . |
| 4,101,738 | 7/1978 | Bellanger et al. . |
| 4,112,374 | 9/1978 | Steinbrecher . |
| 4,206,320 | 6/1980 | Keasler et al. . |
| 4,230,956 | 10/1980 | Steinbrecher . |
| 4,237,551 | 12/1980 | Narasimha . |
| 4,355,405 | 10/1982 | Ruys et al. . |
| 4,492,962 | 1/1985 | Hansen . |
| 4,514,760 | 4/1985 | Balaban et al. . |
| 4,517,586 | 5/1985 | Balaban et al. . |
| 4,621,337 | 11/1986 | Cates et al. . |
| 4,652,858 | 3/1987 | Kokubo et al. . |
| 4,692,737 | 9/1987 | Stikvoort et al. ................. 375/243 |
| 4,803,727 | 2/1989 | Holt et al. . |
| 4,876,542 | 10/1989 | van Bavel et al. . |
| 4,881,222 | 11/1989 | Goeckler et al. . |
| 4,884,265 | 11/1989 | Schroeder et al. . |
| 4,893,316 | 1/1990 | Janc et al. . |
| 4,901,265 | 2/1990 | Kerr et al. . |
| 4,951,237 | 8/1990 | Essenwanger . |
| 5,073,869 | 12/1991 | Bjerede . |
| 5,101,501 | 3/1992 | Gilhousen et al. . |
| 5,103,459 | 4/1992 | Gilhousen et al. . |
| 5,109,390 | 4/1992 | Gilhousen et al. . |
| 5,136,612 | 8/1992 | Bi . |
| 5,159,608 | 10/1992 | Falconer et al. . |
| 5,170,413 | 12/1992 | Hess et al. . |
| 5,187,809 | 2/1993 | Rich et al. . |
| 5,224,122 | 6/1993 | Bruckert . |
| 5,228,054 | 7/1993 | Rueth et al. . |
| 5,291,428 | 3/1994 | Twitchell et al. . |
| 5,293,329 | 3/1994 | Wishart et al. . |
| 5,295,153 | 3/1994 | Gudmundson . |
| 5,299,192 | 3/1994 | Guo et al. . |
| 5,313,279 | 5/1994 | Wang et al. . |
| 5,323,157 | 6/1994 | Ledzius et al. . |
| 5,347,284 | 9/1994 | Volpi et al. . |
| 5,396,489 | 3/1995 | Harrison . |
| 5,406,629 | 4/1995 | Harrison et al. . |
| 5,424,739 | 6/1995 | Norsworthy et al. ................. 341/143 |

FOREIGN PATENT DOCUMENTS

95/12261  5/1995  WIPO .

OTHER PUBLICATIONS

Harris Semiconductor Digital Signal Processing Databook, "Numerically Controlled Oscillator/Modulator", HSP45116, pp. 5–26/5–40, Harris Corporation.

Fundamentals of Digital Image Processing by Anil K. Jain, University of California, Davis, 1989 by Prentice–Hall, Inc., pp. 155–159, 185–187.

(List continued on next page.)

*Primary Examiner*—Young T. Tse
*Assistant Examiner*—Don Vo
*Attorney, Agent, or Firm*—Anthony G. Sitko, Jr.; Jeffrey G. Toler

[57] ABSTRACT

In a quantization noise reduction circuit (200), a feedback signal (W) is added to an input signal (X) to the quantization circuit to reduce quantization noise. The feedback signal is generated as a filtered difference between a sample of a N bit signal (X') and a time coincident sample of a M bit quantized signal, where M<N. The feedback signal is subtracted from the input signal (X) prior to quantization thereby introducing out of band noise into the input signal for reducing in band noise in the quantized signal (Y).

14 Claims, 3 Drawing Sheets

OTHER PUBLICATIONS

"Robust Digital Filter Structures", 7–3 Cascade Form Digital Filter Structures, Handbook for Digital Signal Processing by Sanjit Mitra and James Kaiser, John Wiley & Sons 1993.

Hogenauer, Eugene B. "An Economical Class of Digital Filters for Decimation and Interpolation", IEEE Transactions on Acoustics, Speech and Signal Processing, vol. ASSP–29, No. 2.

ETSI–SMG, GSM 06.31, 4.0.0, Discontinuous Transmission (DTX) for Full Rate Speech Transmission Channels, Oct. 1992.

ETSI–SMG, GSM 06.12, 4.0.1, Comfort Noise Aspects for Full Rate Speech Traffic Channels, Jan. 1993.

EIA/TIA/IS–95, Requireemnts for Base Station CDMA Operation, Pp. 7–1/7–185, Appendix A Requiremetns for CDMA Service OptionsA–1/A–68.

METHOD AND APPARATUS FOR REDUCING QUANTIZATION NOISE

This is a continuation-in-part of application Ser. No. 08/366,283 filed Dec. 29, 1994.

FIELD OF THE INVENTION

The present invention relates generally to digital signal processing, and more particularly, to a method and apparatus for reducing quantization noise in digital signal processing applications.

BACKGROUND OF THE INVENTION

Digital signal processing is evolving as the preferred implementation in many signal processing applications. The advent of improved, higher speed and lower cost digital signal processors (DSPs) and other digital circuit elements coupled with increased flexibility and accuracy of digital circuits is driving a move to converting a number of signal processing applications from the analog forum to the digital forum. Digital signal processing, while offering the above mentioned advantages and other advantages, does not come without some drawbacks. For example, some applications, particularly in the field of radio frequency (RF) communications, are inherently analog. Signal processing for RF applications often require converting an analog signal, for example an RF or intermediate frequency (IF) signal, to a digital signal and likewise converting digital signals to analog signals. An example of such an application is in wideband digital transceivers such as shown and described in commonly assigned U.S. patent application Ser. No. 08/366,283, the disclosure of which is hereby expressly incorporated herein by reference.

In many digital processing applications, including those accomplished in a wideband digital transceiver, the precision of a signal must be converted from a high level of precision to a lower level of precision. For example, a signal represented as 32 bits of information may have to be reduced to a signal represented as 16 bits of information. This is due to the limited capabilities of certain digital processing elements such as, for example, digital-to-analog converters (DACs). In making such a conversion, however, there is a loss of information. One will appreciate in the above example that 32 bits can represent more information than 16 bits at a given data rate. The result of this loss of information is quantization noise.

Referring to FIG. 1, a typical example is shown to illustrate the effects of quantization noise. In the application illustrated, a 16 bit digital signal X of given frequency is to be converted to an analog signal by DAC 10. However, DAC 10 is only a 12 bit device. Therefore, the signal X must be first converted to a 12 bit signal. A typical approach is to use a hard quantizer 12 which truncates the least significant bits (LSBs), in this case the 4 LSBs, of signal X to create a 12 bit signal Y. The noise relative to the carrier signal in decibels (dBc) of this application is given as:

$$\text{noise (dBc)} = 20 \log 2^{-n}$$

where n is the number of bits of the DAC. Thus, the noise level is (−72) dBc for the 12 bit DAC and would be, for example, (−78) dBc for a 13 bit DAC, etc. Often the noise is distributed over the entire Nyquist bandwidth and the noise power per Hertz is negligible. However, frequently the noise appears at discreet frequencies, like second and third harmonics of the signal, which pose significant problems.

To overcome the problem of noise dwelling at particular frequencies, it has been proposed to introduce psuedorandom noise to the signal, often referred to as dithering. A number of dithering techniques are taught in U.S. Pat. Nos. 4,901,265, 4,951,237, 5,073,869, 5,228,054 and 5,291,428. A major disadvantage of dithering is the requirement of having to provide pseudorandom noise generator circuitry which is often complex making the application implementation intensive and costly.

Therefore, a need exists for a method and apparatus for reducing quantization noise without significantly increasing the cost and complexity of the digital signal processing circuit.

DETAILED DESCRIPTION OF THE PREFERRED EMBODIMENT

According to the present invention, a feedback signal is provided to the input of a quantization circuit to reduce quantization noise. The feedback signal is generated as a filtered difference between a sample of the N bit signal and a time coincident sample of a M bit quantized signal, where M<N. The feedback signal is subtracted from the input signal prior to quantization thereby introducing out of band noise into the input signal for reducing in band noise in the quantized signal.

Figure 1:
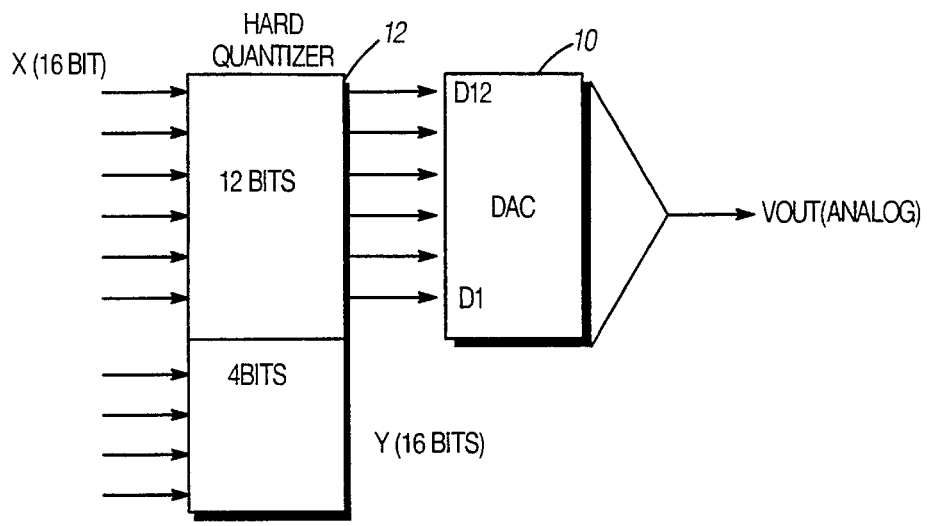
FIG. 1 is a block diagram representation of a prior art 16 bit to 12 bit quantization circuit.
Figure 2:
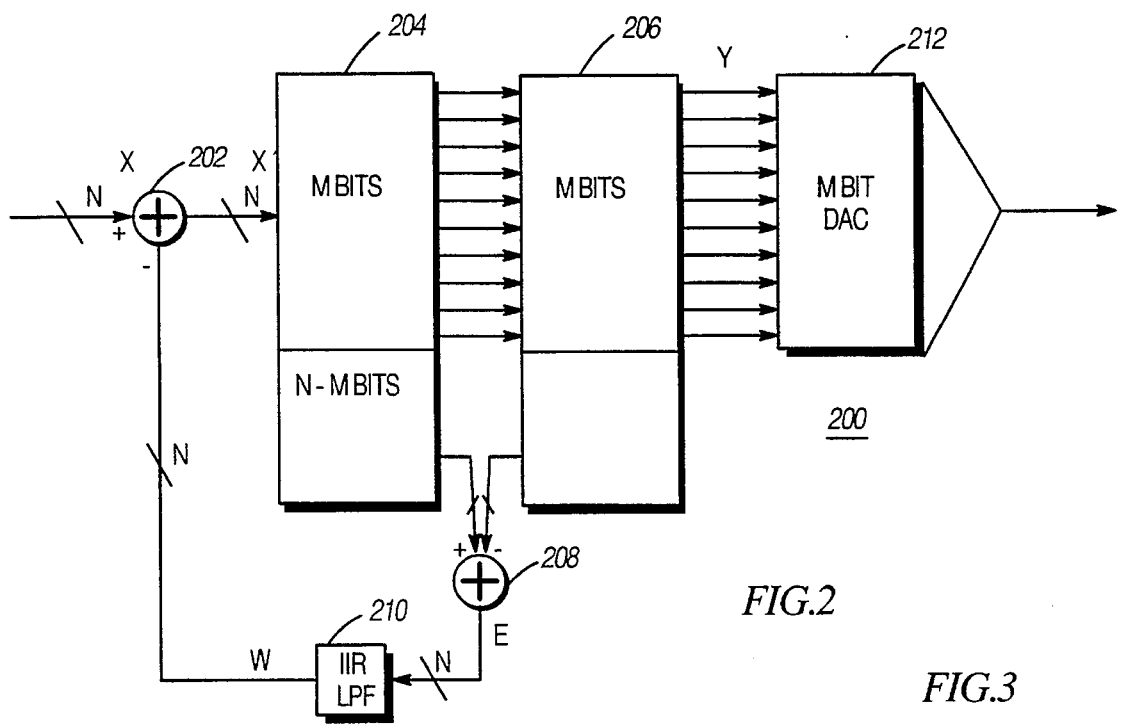
FIG. 2 is a block diagram representation of a quantization circuit in accordance with a preferred embodiment of the present invention.

With reference to FIG. 2, a N bit to M bit, where M<N, quantization circuit 200 in accordance with the present invention is shown. A N bit signal X, is coupled to a summer 202 where a N bit feedback signal W is subtracted. The resulting signal X' is then sampled in a N bit latch 204 and concomitantly quantized in a M bit hard quantizer 206. Hard quantizer truncates the N−M LSBs of signal X', effectively setting the N−M LSBs to a value of zero. A N bit error signal E, is generated in summer 208 as the difference between the M most signification bits (MSBs) of the N bit sample of X' contained in latch 204 and the M bit quantized sample contained in hard quantizer 206. The LSBs of the N bit sample of X' pass unchanged. Error signal E is filtered through filter 210 creating N bit feedback signal W. It should be appreciated, however, that any M bits of signal X' may retained in hard quantizer 206 depending on the particular application.

Further shown in FIG. 2 is a 12 bit DAC 212 for converting hard quantizer output signal Y to an analog signal. It should be understood, however, that quantization circuit 200 of the present invention is useful in any digital signal processing application requiring a conversion from a high precision information signal to a lower precision information signal where it is critical to avoid introduction of quantization noise.

Figure 4:
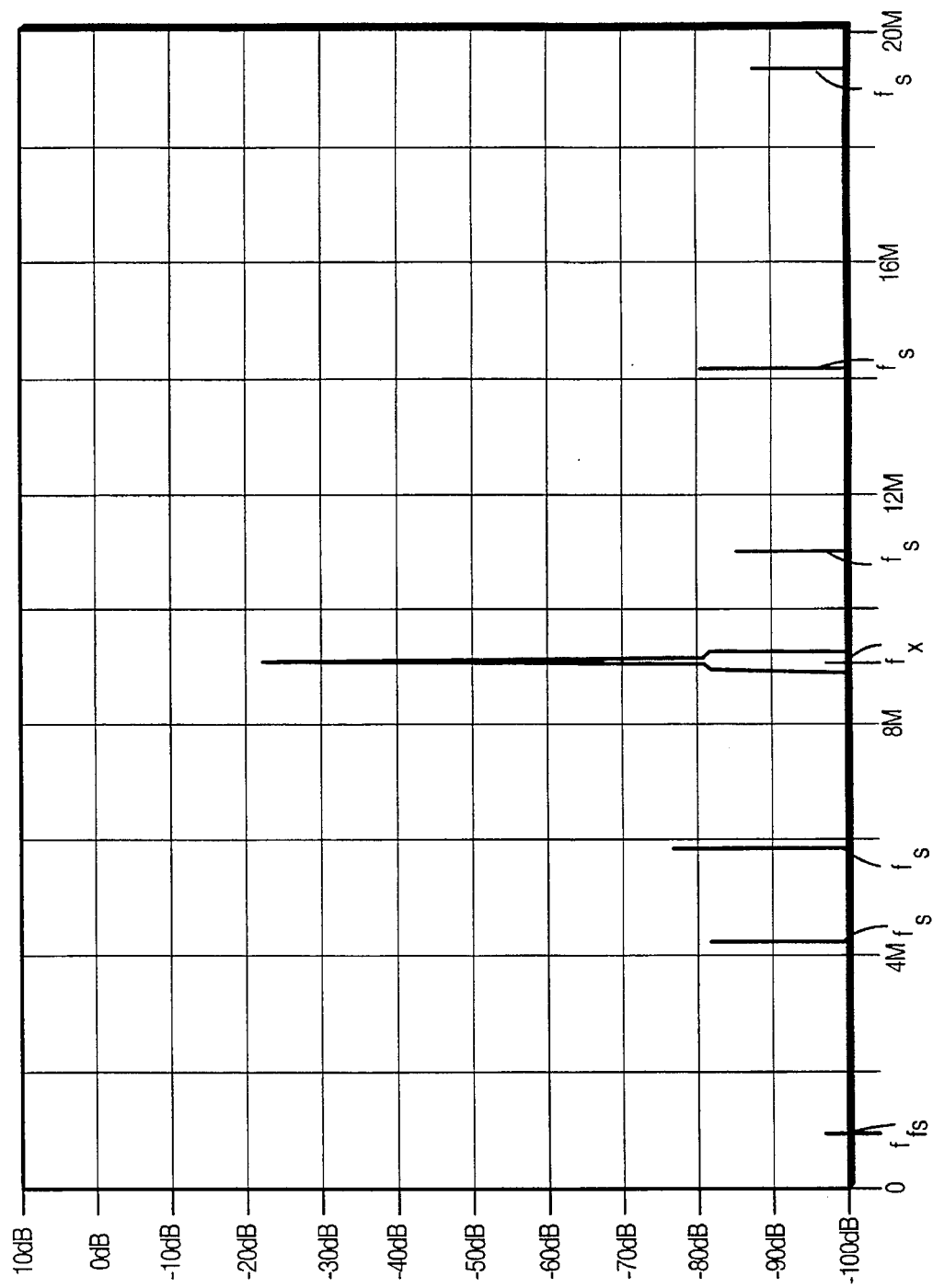
FIG. 4 is graph spectrally illustrating quantization noise based upon truncation without the present invention.
Figure 5:
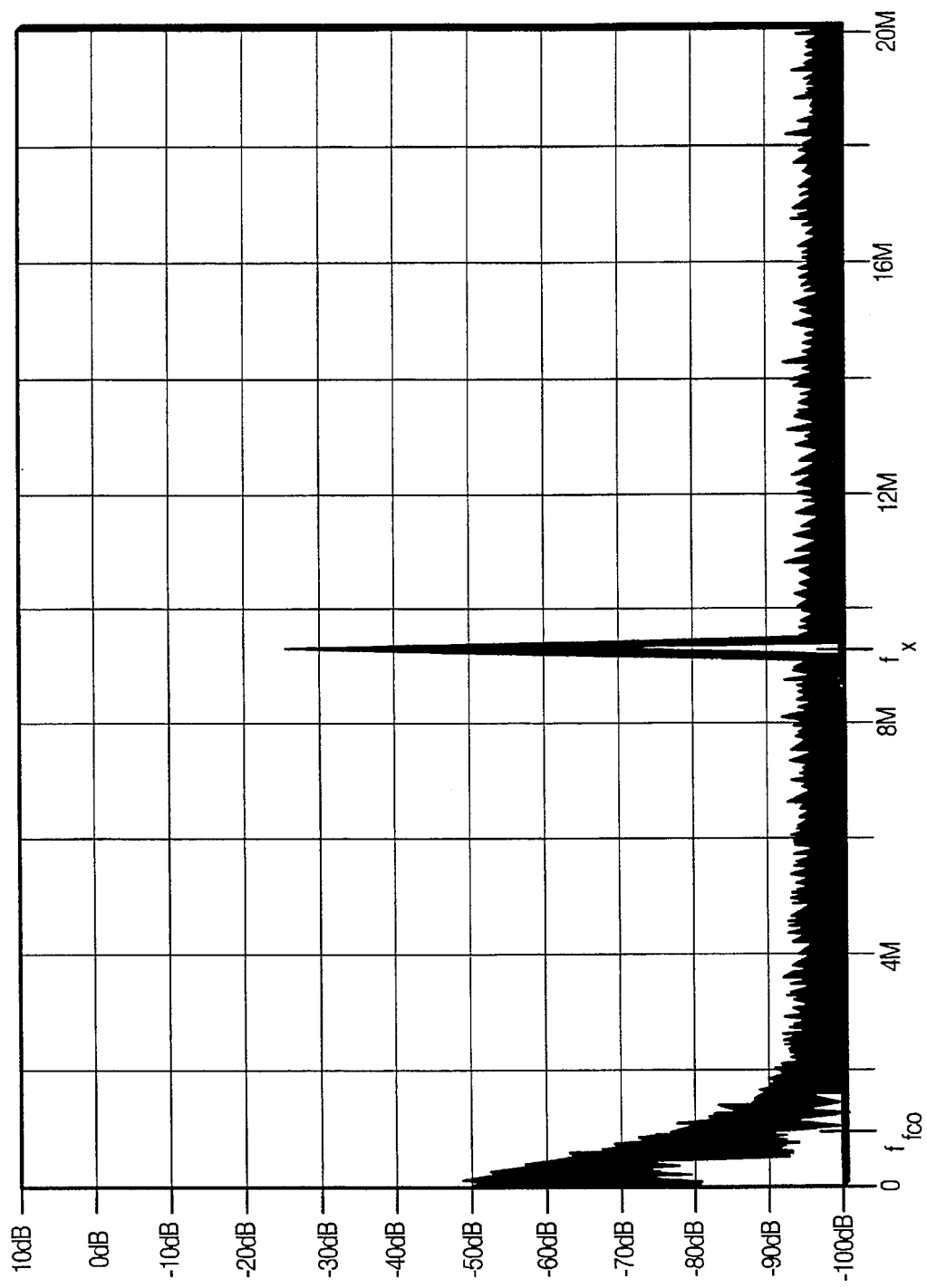
FIG. 5 is graph spectrally illustrating the performance of the quantization circuit of FIG. 2.

Filter 210 is chosen to pass only components of error signal E which are out of band with respect to input signal X. In the preferred embodiment, filter 210 is a low pass filter which substantially maintains the noise components introduced into signal X' by feedback signal W at low frequencies and away from the band of interest. This is illustrated in FIGS. 4 and 5. As can seen in the FIG. 4, without the present invention, spurious noise components, illustrated at $f_s$, having signicant energy are present around the signal of interest illustrate at $f_x$. As can be seen in FIG. 5, while there is a substantial amount of energy below a frequency $f_{fco}$, the cut off frequency of filter 210, there is only a low level of noise which is substantially evenly distributed about the signal of interest at frequency $f_x$. In testing the present invention, a noise floor of (−93) dBc was observed about $f_x$ as compare to (−72) dBc as may be typically expected from a 12 bit quantizer without the present invention. These data were generated referencing the analog signal output of DAC 212.

Another feature of the quantization circuit 200 is that when signal X is not present, or is substantially zero, there is no noise output. With prior art dithering techniques, psuedorandom noise is continuously input to the quantization circuit. When no input signal is present, the output signal of the quantization circuit is the pseudorandum noise. In the present invention, when input signal X is absent or substantially zero, the difference taken between the N bit sample of X' and the M bit quantized sample is substantially zero. Hence, the output of quantization circuit 200 is zero when no input signal is present.

As described with respect to a preferred implementation of quantization circuit 200, error signal E is a 16 bit signal. However, since it is the N–M LSBs which primarily contribute to error signal E, a N–M bit signal could be substituted. In such an implementation, the sign information of error signal E will be lost. Hence, it may be more desirable to implement a (N–M)+1 bit error signal which retains the sign bit from signal X'. Such an implementation simplifies the data path for error signal E as well as reduces the size of filter 210.

Figure 3:
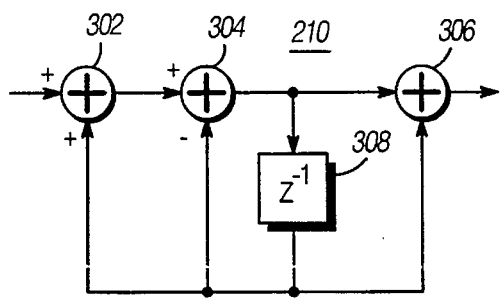
FIG. 3 is a transfer function representation of a filter for use in the quantization circuit shown in FIG. 2.

With reference to FIG. 3, a transfer function for a preferred implementation of filter 210 is shown. As can be seen in FIG. 3, filter 210 is a 3 real pole filter which can be implemented using three full adders 302, 304 and 306 and one delay element 308. In the preferred embodiment of the present invention, the poles of filter 210 are selected to be at $15/16$ which allows for the simplified implementation shown in FIG. 3. As can be seen, this implementation advantageously eliminates the need for multipliers which allows a simplified implementation of filter 210 in an application specific integrated circuit (ASIC). Filter 210 further includes an overall gain factor, in the preferred embodiment approximately 100 dB. Gain is provided at each stage of filter 210 which enhances the level of feedback signal W with respect to input signal X and hence the noise generating effect of feedback signal W on input signal X.

As will be appreciated from the foregoing, the quantization circuit 200 of the present invention provides for a greatly simplified implementation particularly with respect to ASIC implementation. The elimination of the pseudorandom noise generator previously required for dithering techniques and advantageous selection of filter design minimize required gates in the ASIC. These and many other advantages and uses of the present invention will be appreciated by those of ordinary skill in the art from the foregoing description and the following claims.

We claim:

1. An apparatus for reducing quantization noise comprising:

a first adder having a first input coupled to receive a N bit input signal;

a N bit latch having an input coupled to receive an output of the first adder;

a M bit hard quantizer having an input coupled to receive an output of the N bit latch, where M is greater than one and less than N, and an M bit output;

a second adder having a first input coupled to receive a N bit sample from the N bit latch and a second input coupled to receive a N bit sample from the M bit hard quantizer where the N bit sample from the M bit hard quantizer comprises M bits of the N bit sample and at least one N–M zero bit;

a filter having an input coupled to receive an output of the second adder and an output coupled to a second input of the first adder.

2. The apparatus of claim 1 wherein the first adder is operable to take a difference between the first input and the second input.

3. The apparatus of claim 1 wherein the second adder is operable to take a difference between the first input and the second input.

4. The apparatus of claim 1 wherein the filter is a low pass filter.

5. The apparatus of claim 1 wherein the filter has a cut-off frequency substantially below a usable bandwidth of the N bit input signal.

6. The apparatus of claim 1 wherein the filter has a gain greater than unity.

7. The apparatus of claim 1 wherein the N bit sample from the M bit hard quantizer comprises M most significant bits of the N bit sample from the N bit latch and at least one N–M zero bit.

8. The apparatus of claim 1 wherein the N bit sample from the M bit hard quantizer comprises M most significant bits corresponding to M most signficant bits of the N bit sample from the N bit latch and N–M zero bits.

9. A M bit digital to analog converter for converting a N, where N>M and M is greater than one, bit signal comprising:

a first adder having a first input coupled to receive the N bit signal;

a N bit latch having an input coupled to receive an output of the first adder;

a M bit hard quantizer having an input coupled to receive an output of the N bit latch;

a second adder having a first input coupled to receive a N bit sample from the N bit latch and a second input coupled to receive a N bit sample from the M bit hard quantizer where the N bit sample from the M bit hard quantizer comprises M bits of the N bit sample and N–M zero bits;

a filter having an input coupled to receive an output of the second adder and an output coupled the second input of the first adder; and a M bit digital-to-analog converter having an input coupled to the M bit hard quantizer to receive a M bit quantization of the N bit signal and an analog output.

10. The M bit digital-to-analog converter of claim 9 wherein the first adder is operable to take a difference between the first input and the second input.

11. The M bit digital-to-analog converter of claim 9 wherein the second adder is operable to take a difference between the first input and the second input.

12. The M bit digital-to-analog converter of claim 9 wherein the N bit sample from the M bit hard quantizer comprises M most significant bits of the N bit sample from the N bit latch and N–M zero bits.

13. The M bit digital-to-analog converter of claim 9 wherein the filter substantially reduces noise components in a predetermined frequency band.

14. The M bit digital-to-analog converter of claim 9 wherein the filter comprises a low pass filter.

* * * * *